(12) United States Patent
Tsai et al.

(10) Patent No.: US 7,994,428 B2
(45) Date of Patent: Aug. 9, 2011

(54) ELECTRONIC CARRIER BOARD

(75) Inventors: Kuo-Ching Tsai, Taichung Hsien (TW); Chang-fu Lin Chang, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 484 days.

(21) Appl. No.: 12/335,449

(22) Filed: Dec. 15, 2008

(65) Prior Publication Data

US 2009/0272563 A1 Nov. 5, 2009

(30) Foreign Application Priority Data

May 5, 2008 (TW) ................................ 97116428 A

(51) Int. Cl.
*H01L 23/48* (2006.01)
*H05K 1/03* (2006.01)
(52) U.S. Cl. ........ 174/255; 361/760; 257/738; 257/737; 257/780

(58) Field of Classification Search ........................ None
See application file for complete search history.

(56) References Cited

U.S. PATENT DOCUMENTS

| | | | | |
|---|---|---|---|---|
| 6,139,348 A | * | 10/2000 | Fukunaga | 439/266 |
| 6,562,545 B1 | * | 5/2003 | Hembree et al. | 430/313 |
| 7,064,435 B2 | * | 6/2006 | Chung et al. | 257/738 |
| 7,265,430 B2 | * | 9/2007 | Naito et al. | 257/421 |
| 2010/0073531 A1 | * | 3/2010 | Yano et al. | 348/294 |

* cited by examiner

*Primary Examiner* — Boris Chervinsky
(74) *Attorney, Agent, or Firm* — Peter F. Corless; Steven M. Jensen; Edwards Angell Palmer & Dodge LLP

(57) ABSTRACT

An electronic carrier board for a chip to be mounted thereon is provided, which includes a body and a plurality of solder pads. The solder pads have carrying surfaces for carrying the chip thereon through conductive bumps. The carrying surfaces of at least two solder pads are oppositely inclined with respect to each other, thereby preventing the conductive bumps mounted on the carrying surfaces from displacement and thereby further preventing two adjacent conductive bumps subject to displacement from coming into short-circuit contact.

11 Claims, 3 Drawing Sheets

ELECTRONIC CARRIER BOARD

BACKGROUND OF THE INVENTION

1. Field of the Invention

The present invention relates generally to electronic carrier boards, and more particularly to an electronic carrier board applicable to surface mounted technology (SMT).

2. Description of Related Art

With the rapid development of IC manufacturing technology, electronic elements have been continuously designed and fabricated to have a minimized profile. Meanwhile, based on large-scale and highly integrated electronic circuits, IC-based products possess more complete functionality.

Conventionally, electronic elements are mounted on an electronic circuit board such as a printed circuit board (PCB), a circuit board or a substrate by through hole technology (THT). However, as the electronic elements used in the THT cannot be further reduced in size, the electronic elements occupy large spaces of the electronic carrier board. In addition, the electronic carrier board needs to have through holes corresponding to the pins of the electronic elements. Also, solder joints formed between the electronic elements and the electronic carrier board are relatively large. Due to these drawbacks, surface mounted technology (SMT) is widely employed nowadays in the mounting process of electronic elements for efficiently mounting electronic elements to an electronic carrier board.

By the THT, through holes need to be formed in an electronic carrier board for accommodating the pins of the electronic elements and the back surface of the electronic carrier board cannot be efficiently used since solder joints are formed thereon. Accordingly, conventional through hole type elements have been replaced by surface mount type elements that can be much smaller in size.

In a conventional flip-chip ball grid array (FCBGA) package, an underfill is filled between a chip and surface of a substrate so as to encapsulate conductive bumps, thereby increasing the strength of the conductive bumps and supporting the chip. Meanwhile, a plurality of solder balls serving as I/O connections is mounted on the other surface of the substrate. Thus, the volume of the package is greatly reduced with the substrate size being close to the chip size. Meanwhile, the need of bond wires is eliminated, thereby reducing the resistance and improving the electrical performance. Related techniques are disclosed in U.S. Pat. No. 6,153,930, No. 6,400,036, No. 6,391,683, No. 5,892,289 and No. 5,218,234.

Referring to FIGS. 1A and 1B, a conventional electronic carrier board with a chip mounted thereon before being package is shown. Therein, a plurality of solder pads 11 spaced from each other is formed on predefined positions of the electronic carrier board 1, and a plurality of solder bumps 12 is mounted on the bottom surface of the chip 13. The solder bumps 12 are aligned with the solder pads 11, and the solder bumps 12 are reflowed to form ball shape so as to join the chip 13 and the electronic carrier board 1 together and establish electrical connection therebetween.

However, the chip 13 may be slightly displaced due to vibration transferred by a rail during a reflow process. Since the carrying surfaces of the solder pads 11 and the surface of the carrier board 1 are substantially parallel to each other, the displacement of the chip 13 can easily cause slide of the solder bumps 12 and further cause adjacent solder bumps 12 to join together, as shown in FIG. 1B. Thus, the solder bumps 12 and the solder pads 11 cannot be correctly positioned and a short circuit problem may occur. Even worse, it fails to establish electrical connection between the chip 13 and the electronic carrier board 1.

Also, referring to FIG. 2, as disclosed by U.S. Pat. No. 5,477,086, a round-shaped through hole 211 is formed in the center of a column-shaped solder pad 21 and an opening 212 is formed at one side of the through hole 211 such that a solder bump can be positioned on the solder pad 21 through the through hole 211 and the opening 212 permits gas to escape. However, the through hole 211 is required to be precisely located at the center of the solder pad 21 so as to prevent adjacent bumps from joining together. Otherwise, the desired effect cannot be achieved. Also, the precise alignment of the through hole 211 complicates the fabrication process and increases the fabrication cost and time.

Therefore, how to provide an electronic carrier board so as to overcome the above-described drawbacks has become urgent.

SUMMARY OF THE INVENTION

According to the above drawbacks, the present invention is to provide an electronic carrier board for preventing adjacent conductive bumps from coming into contact that could result in a short circuit problem, securely positioning a chip mounted thereon, and improving the product yield.

In order to accomplish the above and other improvements, the present invention provides an electronic carrier board for a chip to be mounted thereon. The electronic carrier board comprises: a body; and a plurality of solder pads formed on the body, each of which has a carrying surface for carrying the chip. The electronic carrier board is characterized in that the carrying surfaces of at least two solder pads are oppositely inclined with respect to each other such that conductive bumps can be securely mounted on the carrying surfaces so as to prevent adjacent conductive bumps from joining together that could result in a short circuit problem.

The carrying surfaces can be outwardly inclined of the body or inclined towards inner sides of the base body. Alternatively, part of the solder pads have carrying surfaces inclined towards outer sides of the base body and another part of the solder pads have carrying surfaces inclined towards inner sides of the base body so as to more securely mount the conductive bumps on the carrying surfaces and stably position the chip on the electronic carrier board.

Compared with the prior art, the present invention forms oppositely inclined carrying surfaces on solder pads so as to securely mount the conductive bumps on the carrying surfaces, thereby preventing adjacent conductive bumps from joining together as in the prior art that could result in a short circuit problem. Meanwhile, the present invention securely positions the chip on the electronic carrier board through the carrying surfaces that are inclined in different directions.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. It should be noted that the drawings provided herein are all simplified views illustrating the basic structure of the present invention and the components applied are not limited to what is shown in the preferred embodiments. The present invention may also be implemented and applied according to other embodiments, and the details may be modified based on different views and applications without departing from the spirit of the invention.

First Embodiment

Figure 1A:
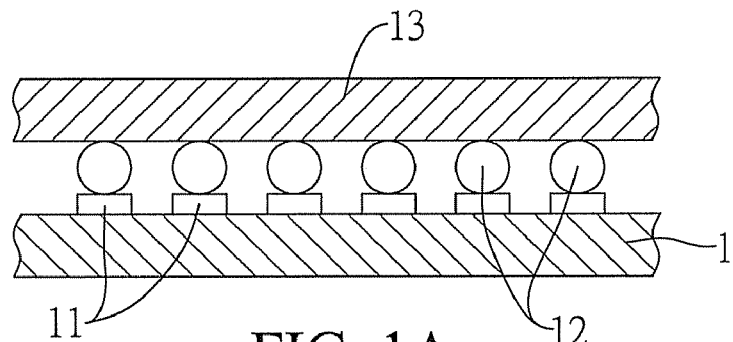
FIG. 1A is a side view of a conventional electronic carrier board with a chip mounted thereon before being packaged.
Figure 1B:
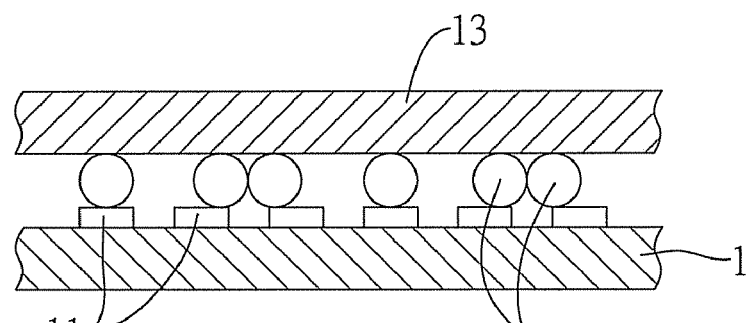
FIG. 1B is a side view of the electronic carrier board of FIG. 1A with adjacent conductive bumps joining together.
Figure 2:
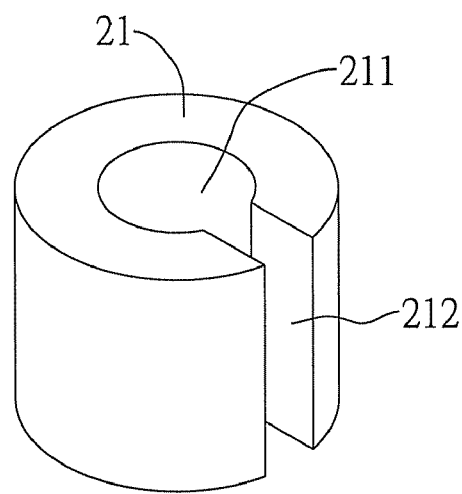
FIG. 2 is a perspective diagram of a solder pad disclosed by U.S. Pat. No. 5,477,086.
Figure 3A:
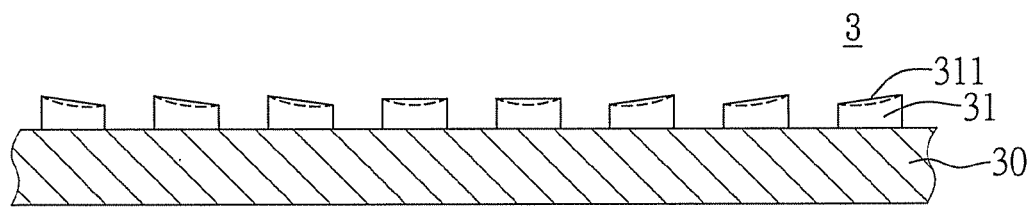
FIG. 3A is a side view of an electronic carrier board according to the present invention.
Figure 3B:
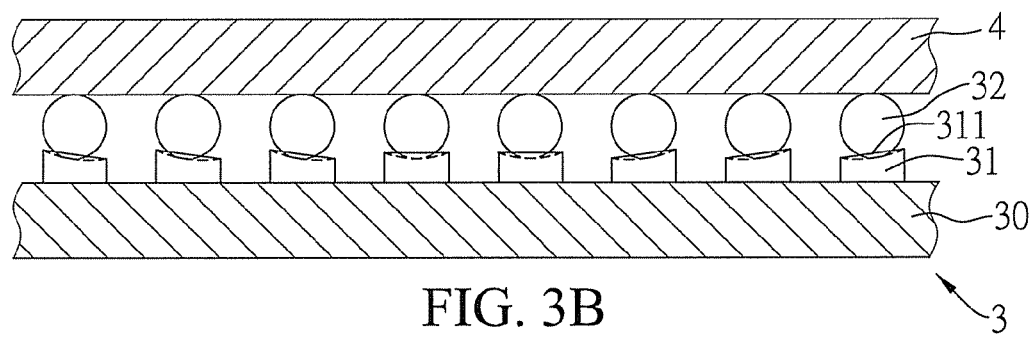
FIG. 3B is a side view of an electronic carrier board with a chip mounted thereon according to a first embodiment of the present invention.

FIGS. 3A and 3B are side views of an electronic carrier board and the electronic carrier board with a chip mounted thereon according to a first embodiment of the present invention. As shown in the drawings, the electronic carrier board 3 comprises a base body 30 and a plurality of solder pads 31 formed on surface of the base body 30. Each of the solder pads 31 has an arc-shaped carrying surface 311 with a recessed central portion. A chip 4 is mounted on the carrying surfaces 311 through a plurality of conductive bumps 32 so as to establish electrical connection between the electronic carrier board 3 and the chip 4. In the present embodiment, the carrying surfaces 311 of the solder pads 31 located at the central portion of the base body 30 are not inclined, while the carrying surfaces 311 of the solder pads 31 located at two opposite sides of the base body 30 are oppositely inclined with respect to each other, and the carrier surfaces are inclined towards inner sides of the base body 30.

Therefore, a holding force that is focused on the central portion of the base body 30 is generated to securely position the chip 4 on the conductive bumps 32, thereby preventing the chip 4 from being displaced due to vibration caused by external forces. Meanwhile, as the carrying surfaces 311 are arc-shaped surfaces with recessed central portion, the conductive bumps 32 can be stably mounted on the solder pads 31 through the carrying surfaces 311.

Therefore, the chip 4 is securely positioned on the solder pads 31 and the conductive bumps 32 are stably mounted on the carrying surfaces 311, thereby preventing displacement of the chip 4 and preventing adjacent conductive bumps 32 from joining together during a melting process that could result in a short circuit problem.

Furthermore, the base body 30 is one of an insulating layer and an insulating layer with a circuit layer stacked therein, and the conductive bumps 32 are solder balls.

Second Embodiment

Figure 4:
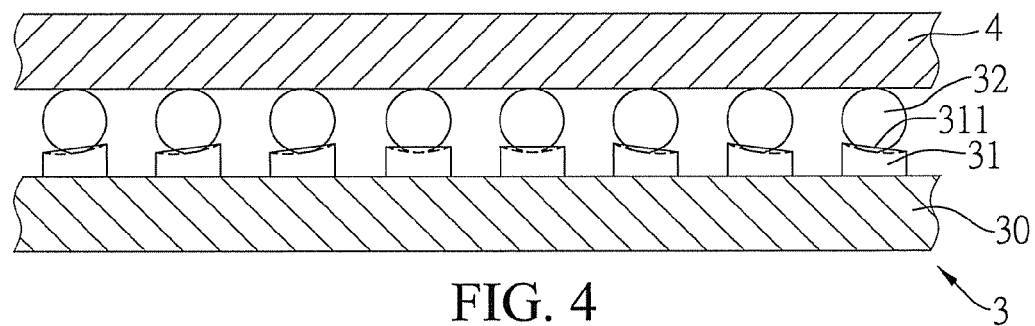
FIG. 4 is a side view of an electronic carrier board with a chip mounted thereon according to a second embodiment of the present invention.

FIG. 4 is a side view of an electronic carrier board with a chip mounted thereon according to a second embodiment of the present invention. Similar to the first embodiment, the electronic carrier board 3 comprises the base body 30 and the plurality of solder pads 31 formed on the surface of the base body 30, wherein each of the solder pads 31 has an arc-shaped carrying surface 311 with a recessed central portion, and the chip 4 is mounted on the carrying surfaces 311 through the plurality of conductive bumps 32 so as to establish electrical connection between the chip 4 and the electronic carrier board 3. A difference of the present embodiment from the first embodiment is the carrying surfaces 311 of the solder pads 31 located at two opposite sides of the base body 30 are inclined towards outer sides of the base body 30 while the carrier surfaces 311 of the solder pads 31 located at the central portion of the base body 30 are not inclined.

Therefore, an outward holding force is generated to securely position the chip 4 on the conductive bumps 32 so as to prevent the chip 4 from being displaced due to vibration caused by external forces. Meanwhile, as the carrying surfaces 311 are arc-shaped surfaces with recessed central portion, the conductive bumps 32 can be stably mounted on the solder pads 31 through the carrying surfaces 311.

Therefore, the chip 4 is securely positioned on the solder pads 31 and the conductive bumps 32 are stably mounted on the carrying surfaces 311, thereby preventing displacement of the chip 4 and preventing adjacent conductive bumps 32 from joining together during a melting process that could result in a short circuit problem.

Third Embodiment

Figure 5:
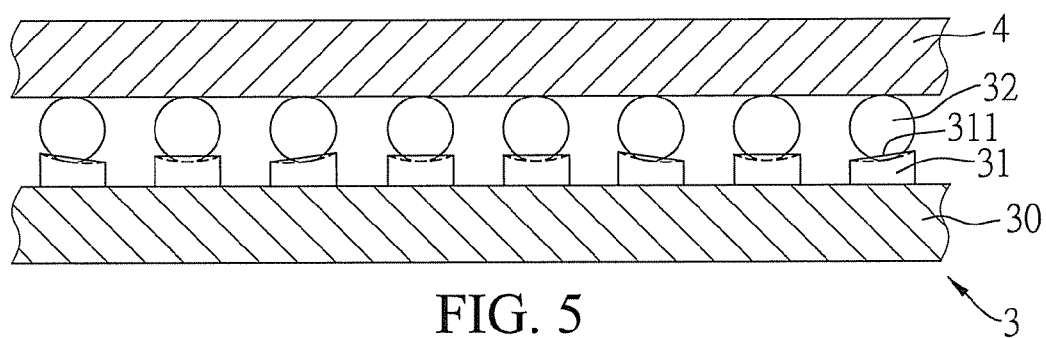
FIG. 5 is a side view of an electronic carrier board with a chip mounted thereon according to a third embodiment of the present invention.

FIG. 5 is a side view of an electronic carrier board with a chip mounted thereon according to a third embodiment of the present invention. Similar to the first embodiment, the electronic carrier board 3 comprises the base body 30 and the plurality of solder pads 31 formed on the surface of the base body 30, wherein each of the solder pads 31 has an arc-shaped carrying surface 311 with a recessed central portion, and the chip 4 is mounted on the carrying surfaces 311 through the plurality of conductive bumps 32 so as to establish electrical connection between the chip 4 and the electronic carrier board 3. The carrying surfaces 311 of the solder pads 31 located at the central portion of the base body 30 are not inclined A difference of the present embodiment from the above-described embodiments is, the carrying surfaces 311 of the solder pads 31 located at two sides of the base body 30 are locally symmetrical, that is, three of the solder pads 31 constitute a group, the carrier surface 311 of the solder pad 31 located at the center of the group is not inclined, and the carrying surfaces 311 of the solder pads 31 located at two sides of the group are inclined towards the solder pad 31 located at the center of the group.

In such a way, several local interference forces are generated to securely position the chip 4 on the conductive bumps 32. Meanwhile, as the carrying surfaces 311 are arc-shaped surfaces with recessed central portion, the conductive bumps 32 can be stably mounted on the solder pads 31 through the carrying surfaces 311.

Therefore, the chip 4 is securely positioned on the solder pads 31 and the conductive bumps 32 are stably mounted on the carrying surfaces 311 of the solder pads 31, thereby preventing displacement of the chip 4 and preventing adjacent conductive bumps 32 from joining together during a melting process that could result in a short circuit problem.

Fourth Embodiment

Figure 6:
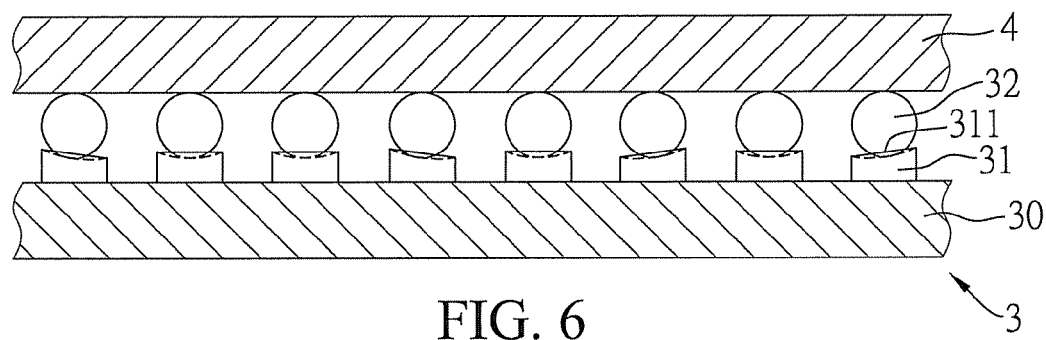
FIG. 6 is a side view of an electronic carrier board with a chip mounted thereon according to a fourth embodiment of the present invention.

FIG. 6 is a side view of an electronic carrier board with a chip mounted thereon according to a fourth embodiment of the present invention. Similar to the first embodiment, the electronic carrier board 3 comprises the base body 30 and the plurality of solder pads 31 formed on the surface of the base body 30, wherein each of the solder pads 31 has an arc-shaped carrying surface 311 with a recessed central portion, and the chip 4 is mounted on the carrying surfaces 311 through the plurality of conductive bumps 32 so as to establish electrical connection between the chip 4 and the electronic carrier board 3. But different from the above-described three embodiments, the carrying surfaces 311 of the solder pads 31 are irregularly arranged, that is, the carrying surfaces 311 of a part of the solder pads 31 are inclined towards a first direction and the carrying surfaces 311 of another part of the solder pads 31 are inclined towards a second direction opposite to the first direction, and the solder pads are arbitrarily arranged on the base body 30. But it should be noted that the number of the carrying surfaces 311 inclined towards the first direction is substantially equal to the number of the carrying surfaces 311 inclined towards the second direction.

Thus, several local interference forces are generated to securely position the chip 4 on the solder pads 31. Meanwhile, as the carrying surfaces 311 are arc-shaped surfaces with recessed central portion, the conductive bumps 32 can be stably mounted on the solder pads 31 through the carrying surfaces 311.

Therefore, the chip 4 is securely positioned on the solder pads 31 and the conductive bumps 32 are stably mounted on the carrying surfaces 311 of the solder pads 31, thereby preventing displacement of the chip 4 and preventing adjacent conductive bumps 32 from joining together during a melting process that could result in a short circuit problem.

Compared with the prior art, the present invention forms oppositely inclined carrying surfaces on at least two solder pads so as to securely mount the conductive bumps on the carrying surfaces and secure the chip on the solder pads, thereby preventing displacement of the chip and further preventing short circuit or poor electrical transmission from occurring. As a result, the product yield is improved, the fabrication time is reduced and the electrical transmission quality is improved.

Therefore, the electronic carrier board according to the present invention overcome the conventional drawbacks and has high industrial application value.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. An electronic carrier board for a chip to be mounted thereon, comprising:
   a body; and
   a plurality of solder pads formed on the body, wherein each of the solder pads has a carrying surface for carrying the chip and the carrying surfaces of at least two solder pads are oppositely inclined with respect to each other.

2. The electronic carrier board of claim 1, wherein the carrying surfaces are arc-shaped surfaces with a recessed central portion.

3. The electronic carrier board of claim 1, wherein the carrying surfaces of the solder pads located at an inner portion of the body are horizontal in surface, and those located at an outer portion of the body outside the inner portion are outwardly inclined.

4. The electronic carrier board of claim 3, wherein the solder pads located at the outer portion of the carrier board are symmetrically arranged.

5. The electronic carrier board of claim 1, wherein the carrying surfaces of the solder pads located at the inner portion of the body are horizontal in surface, and those located at an outer portion of the body outside the inner portion are inwardly inclined.

6. The electronic carrier board of claim 5, wherein the solder pads located at the outer portion of the carrier board are symmetrically arranged.

7. The electronic carrier board of claim 1, wherein the carrying surfaces of a portion of solder pads are inclined towards a first direction, and those of another part of the solder pads are inclined towards a second direction opposite to the first direction, and the solder pads with different inclined directions are irregularly arranged on the body.

8. The electronic carrier board of claim 7, wherein of the solder pads with the carrying surfaces inclined towards the first direction is equal in number to those with the carrying surfaces inclined towards the second direction.

9. The electronic carrier board of claim 1, further comprising a plurality of conductive bumps mounted on the carrying surfaces respectively for electrically connecting the chip to the body.

10. The electronic carrier board of claim 9, wherein the conductive bumps are solder bumps.

11. The electronic carrier board of claim 1, wherein the body of the carrier board is one of an insulating layer and an insulating layer embedded with at least a circuit layer.

* * * * *